(12) United States Patent
Han

(10) Patent No.: US 6,903,026 B2
(45) Date of Patent: Jun. 7, 2005

(54) SPUTTER ETCH METHODS

(75) Inventor: Jae Won Han, Bucheon-si (KR)

(73) Assignee: Anam Semiconductor, Inc., Seoul (KR)

( * ) Notice: Subject to any disclaimer, the term of this patent is extended or adjusted under 35 U.S.C. 154(b) by 0 days.

(21) Appl. No.: 10/875,125

(22) Filed: Jun. 23, 2004

(65) Prior Publication Data

US 2004/0266190 A1 Dec. 30, 2004

(30) Foreign Application Priority Data

Jun. 24, 2003 (KR) .................................. 10-2003-0041032

(51) Int. Cl.⁷ .......................................... H01L 21/302
(52) U.S. Cl. ....................................................... 438/710
(58) Field of Search ................................ 438/714, 710, 438/706, 643, 637, 627

(56) References Cited

U.S. PATENT DOCUMENTS 5,707,498 A    1/1998   Ngan ..................... 204/192.12
6,306,247 B1  10/2001   Lin ............................. 156/345

*Primary Examiner*—Craig A. Thompson
*Assistant Examiner*—Monica D. Harrison
(74) *Attorney, Agent, or Firm*—Hanley, Flight & Zimmerman, LLC

(57) ABSTRACT

A sputter etch method in the semiconductor fabrication is disclosed. A sputter etch method for etching a layer on a semiconductor substrate in a chamber by RF plasma, includes loading a substrate for conditioning into the chamber, depositing a metal coating layer on the inside wall of the chamber by sputter etching the substrate for conditioning in the chamber, unloading the substrate for conditioning from the chamber, loading the semiconductor substrate with the layer, and etching the layer on the semiconductor substrate. Accordingly, the sputter etch method can enhance a reliability for a fabrication process of a semiconductor device under the environment of the substantial decrease in impurity falling probability. In other words, the impurity falling probability can be decreased by coating a metal layer on the wall of the sputter etch chamber employing a wafer on which a barrier metal layer is deposited right before a main lot in a sputter etch process.

10 Claims, 2 Drawing Sheets

SPUTTER ETCH METHODS

TECHNICAL FIELD

The present disclosure relates to semiconductor fabrication, and more particularly, to sputter etch methods for use in semiconductor fabrication.

BACKGROUND

According to high-integration techniques used in the fabrication of semiconductor devices, a metal interconnect line for transmitting an electrical signal to each device is so miniaturized that it causes problems such as increased resistance of the metal interconnect line, which is due to the decreased cross-sectional area and growing of parasitic capacitance owing to the reduction in gaps between adjacent interconnect lines. The increased resistance and the capacitance create a resistor-capacitor (RC) delay time. These effects will be a barrier factor in fabricating high-speed semiconductor devices. The parasitic capacitance in the gaps between the adjacent metal interconnect lines has to be reduced in order to fabricate the high-speed semiconductor device. To reduce this capacitance, application of a low dielectric layer or a metal interconnect line with low resistance is necessary. Particularly, technology for fabricating a metal interconnect line with low resistance may be further improved in process and equipment. Many studies and important projects for establishing the fabrication technology of the high-speed semiconductor device are therefore in progress.

Typically, an aluminum layer deposited by Physical Vapor Deposition (PVD) method was used as a metal layer for a metal interconnect line. However, the aluminum layer deposited using PVD does not solve the step coverage problem in a contact or via hole with a high aspect ratio. To solve this problem, fabrication processes of aluminum reflow and/or aluminum Chemical Vapor Deposition (CVD) have been developed. Using the aluminum reflow process, it is rather difficult to fill a contact hole with an aspect ratio equal to or greater than 3.0. Therefore, the aluminum CVD process is expected to be the prospective alternative for the step coverage problem.

Meanwhile, as the gaps between adjacent interconnect lines are narrowed, the intrinsic resistance of aluminum makes it difficult to improve the RC delay time. Thus a copper CVD process has been recently studied because the intrinsic resistance of copper is just about two-thirds of the intrinsic resistance of aluminum. However, deposition by the aluminum or copper CVD process is highly dependent on the lower layer of the substrate and, in spite of low occurrence of nucleation, after being formed nucleus grows rapidly. Thus, overhang problems such as void formation in a narrow via or contact hole occur. Additionally, the entire area of deposition is so rough that shortcomings such as a poor degree of reflection and low-step coverage take place. That is, defective alignment and overlay in an exposing process occur because of the increase in surface roughness of aluminum or copper and the decrease in a degree of reflection of aluminum or copper. Also, a void formation problem arises from the blockage of a contact hole by the bridge of aluminum crystals protruding from the contact hole. Owing to increase in surface roughness of aluminum deposited by the CVD and void formation from bridge on the side walls of a contact hole, aluminum or copper cannot be used as a filling metal in the conventional CVD process. Instead, after aluminum or copper as a metal for a seed layer is deposited, a via or contact hole is filled by a sputtering method of a PVD or CVD-PVD process.

Because apparatuses for the CVD-PVD process differ in process and control from apparatuses for each of the CVD and PVD processes, such apparatuses have to be built and controlled by an isolation device to avoid contamination. Although the research has been developing various surface processing methods prior to deposition and precursors, there is still much to improve in poor surface roughness and the low speed of deposition.

For a fabrication process of an interconnect line using only CVD in accordance with a prior art, after completion of an appropriate lithography process, de-gassing, etching, and barrier layer forming processes subsequently follow performed, and then a desired interconnect line is deposited by a CVD process.

FIG. 1a through FIG. 1d schematically illustrate, in cross-sectional views, the method of fabricating an interconnect line according to a prior art. Referring first to FIG. 1a, an inter-metal dielectric (IMD)/ pre-metal dielectric (PMD) layer 2 is deposited over a silicon substrate 1 with predetermined lower layer(s) (not shown) in order to thoroughly cover the lower layer(s) with a sufficient thickness. The IMD/PMD layer 2 is etched by a common photo lithography process and then a contact or via disclosing a predetermined hole over the silicon substrate 1 is formed.

Referring to FIG. 1b, a metal layer such as a Ti/TiN layer on inside of a contact hole 3 and over the insulating layer 2 is deposited with a uniform thickness and then the contact hole 3 is completely filled with a tungsten layer 5.

Referring to FIG. 1c, until a barrier metal layer 4 is exposed, a contact plug 5a is formed by etch back or polish of the tungsten layer 5 and then an aluminum layer 6 and an antireflection layer 7 such as a Ti/TiN layer are sequentially deposited on the contact plug 5a and the barrier metal layer 4 by a sputtering process.

As shown in FIG. 1d, an aluminum interconnect line 10 with a contact plug 5a is completed by removing some portion of an antireflection layer 7, an aluminum layer 6 and a barrier metal layer 4 using a common photo lithography process.

However, the above-mentioned process results in a number of problems.

Referring to FIG. 2, a sputter etch process is performed for the purpose of obtaining a stable via resistance by removing a native aluminum oxide layer "(22,23) of a substrate (20)" exposed under a via hole "in an IMD/PMD layer (21) before depositing a barrier metal layer (24)". The sputter etch process enables a barrier metal layer and a tungsten layer to be completely filled without shadow effect of an overhang by slightly widening the mouth of a via hole.

Most of sputter etched particles are exhausted by a vacuum pump, but residual particles (32) are stuck in the inside wall of a sputter etch chamber (30). The particles (32) trapped in the inside wall of the chamber (30) grow larger until the particles fall (33) when the stress of the trapped particles become greater than the adhesion force between them. When they fall, if a sputter etch process is proceeding on a substrate (31), the fallen particles are deposited as impurities on the substrate. If the fallen impurities deposited on the substrate block a hole, it is impossible to deposit a barrier metal layer and a tungsten layer. It thus leads to short circuits between an upper metal layer and a lower metal layer and the semiconductor device malfunctions (FIG. 3).

The inside wall of a sputter etch chamber is made of quartz for electric insulation, so that the sputter etched particles have weak adhesion force. Impurity problem is therefore a grave concern in the sputter etch process.

U.S. Pat. No. 5,707,498, to Kenny King-Tai Ngan, discloses a method of depositing a film on a semiconductor workpiece in an inductively-coupled plasma sputtering chamber so as to avoid contamination of the film by material sputtered off the induction coil.

U.S. Pat. No. 6,306,247, to Cheng Chih Lin, discloses an apparatus and a method for preventing particle contamination in a plasma etch chamber equipped with a middle chamber by residual etchant gas.

DETAILED DESCRIPTION

Figure 1A:
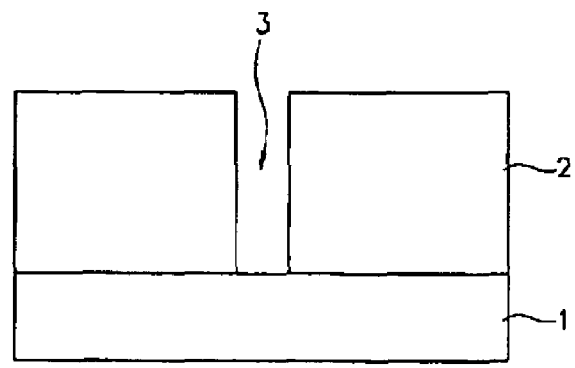
FIG. 1 schematically illustrates, in cross-sectional view, a known method of forming an interconnect line.
Figure 1B:
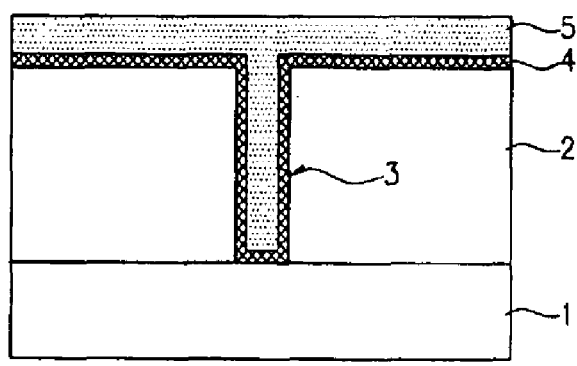
Figure 1C:
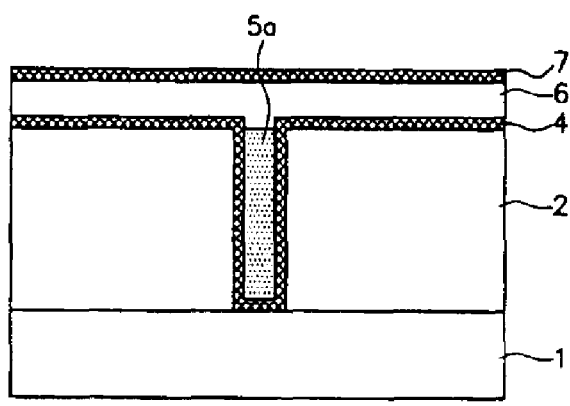
Figure 1D:
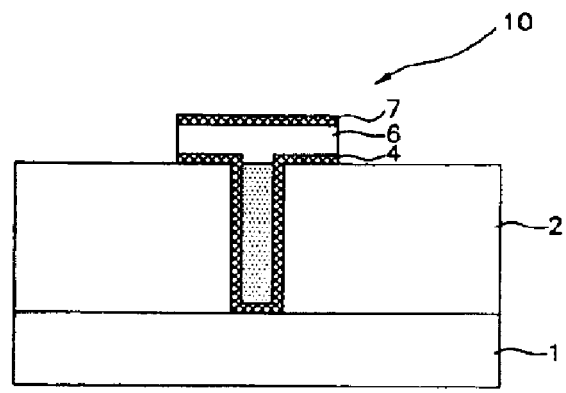
Figure 2:
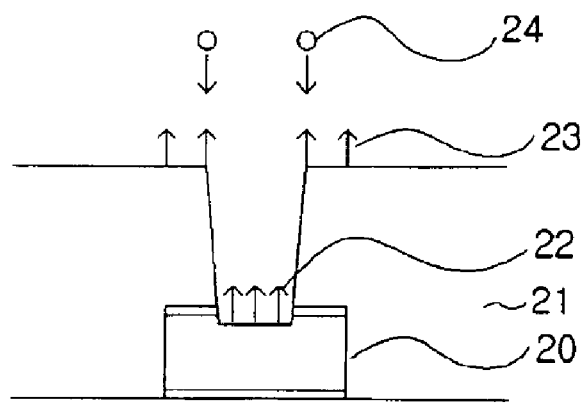
FIG. 2 schematically illustrates, in cross-sectional view, a sputter etch process.
Figure 3:
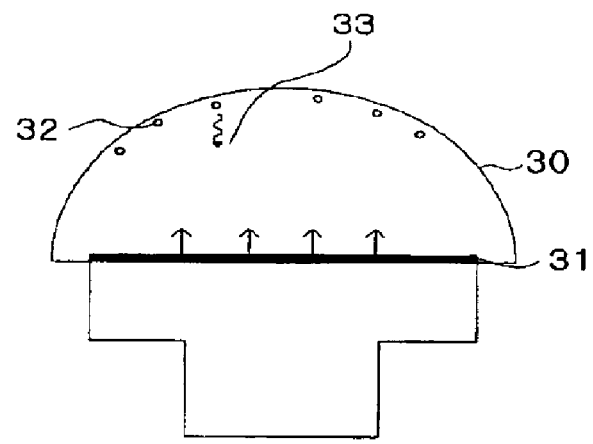
FIG. 3 schematically depicts a diagram for impurities generation in a sputter etch process.

As disclosed herein, according to one implementation, a sputter etch method for etching a layer on a semiconductor substrate in a chamber by radio frequency (RF) plasma includes loading a substrate for conditioning into the chamber, depositing a metal coating layer on the inside wall of the chamber by sputter etching the substrate for conditioning in the chamber, unloading the substrate for conditioning from the chamber, loading the semiconductor substrate with the layer, and etching the layer on the semiconductor substrate.

In some implementations, the metal coating layer deposited on the inside wall of the chamber is one selected from the group consisting of aluminum, an aluminum alloy, an aluminum compound, titanium, a titanium compound, cobalt, a cobalt compound, stainless steel, nickel, a nickel compound, gold, a gold compound, silver, and a silver compound.

The substrate for conditioning in the chamber has a metal layer deposited on the top of the wafer. The metal layer is same as the above one. In one example, the metal layer is deposited with a thickness of 100~15,000 angstroms (Å) by a PVC or CVD method.

In addition, the substrate for conditioning in the chamber is a metal substrate consisting of a metal layer that is made of same material as in the above. In one example, the metal substrate may have a diameter of 199~201 millimeters and a thickness of 0.2~3 millimeters.

In one disclosed example, the sputter etch method for depositing the metal coating uses an RF power supply of 100~150 watts (W) for a substrate, whose frequency is one frequency selected from the group consisting of 13.56 megahertz (MHz) and its multiples, and an RF power supply of 50~300 watts (W) for the inside wall of the chamber, whose frequency is one frequency selected from the group consisting of 400 kilohertz (kHz) and its multiples.

In one example, argon gas flows in the chamber at a rate of 3~10 standard cubic centimeters per minute (sccm). The metal coating in the inside wall of the chamber is performed for 0.5~5 minutes (min) and up to at most 5 times. The metal coating in the inside wall of the chamber is performed at 1~2 times per 1~4 lots before a main lot.

In one implementation, before a sputter etch process of the main lot, a sputter etch process using a substrate with a metal layer deposited thereon is performed to coat a metal coating layer on the inside wall of a chamber. This is called a conditioning for a sputter etch chamber.

Because a metal coating layer on the inside wall of the chamber has a stronger adhesion force than quartz, it is less possible that impurity particles fall by the stress. That is, the possibility of falling impurities in a sputter etch chamber is substantially reduced.

Quartz electrically insulates the inside wall of a chamber from the outside, so that no electrical leakage problems arise from the metal coating layer on the inside wall of the chamber.

Periodical coating using a metal layer on the inside wall of a chamber may be used to avoid falling of the sputter etched particle stuck on the wall during a main lot.

Conditioning for a sputter etch chamber provides the outstanding benefit of substantially removed impurities when it is performed right before a main lot process.

A second disclosed sputter etch method of depositing a metal interconnect of a semiconductor device includes depositing an insulating layer over a substrate with a predetermined structure and forming a hole, performing a sputter etch in a chamber in which a conditioning is completed, depositing a metal barrier layer and a tungsten layer, and removing the metal barrier layer and the tungsten layer by a chemical-mechanical polishing (CMP) or etch-back method.

In such an example, conditioning means depositing a metal coating layer on the inside wall of a sputter etch chamber. According to one example, the metal coating is conducted for 0.5~5 minutes and up to at most 5 times. The conditioning of the sputter etch chamber proceeds at 1~2 times per 1~4 lots before the main lot.

In one example, the coating metal on the inside wall of a sputter etch chamber is one selected from the group consisting of aluminum, an aluminum compound, titanium, a titanium compound, cobalt, a cobalt compound. The coating is conducted on a targeted substrate, on which a metal layer is deposited by means of an RF sputtering process.

According to one implementation, the substrate target for an RF sputtering process may be a silicon wafer having a thickness of 100~15,000 angstroms, on which aluminum, an aluminum alloy including 0.2~1.0% copper, an aluminum alloy including 0.2~1.0% copper and 0.5~2% silicon, or an aluminum alloy including 0.5~2% silicon is deposited.

In addition, per one implementation, the target substrate for an RF sputtering process uses a silicon wafer, with a thickness of 100~10,000 angstroms, on which titanium, a titanium compound, cobalt, or a cobalt compound is deposited.

The metal on the substrate is deposited by a PVD or CVD method.

According to one implementation, the substrate has a diameter of 199~201 mm and a thickness of 0.2~3 mm. The substrate is made from material selected from the group consisting of aluminum, an aluminum alloy, an aluminum compound, titanium, a titanium compound, cobalt, a cobalt compound, stainless steel, nickel, a nickel compound, gold, a gold compound, silver, and a silver compound.

The conditioning in an RF sputtering process uses an RF power supply of 100~500 watts for a target and an RF power supply of 50~300 watts for the inside wall of a chamber. The RF power frequency for a target is one frequency selected from the group consisting of 13.56 megahertz (MHz) and its multiples, and the RF power frequency for the inside wall of a chamber is one frequency selected from the group consisting of 400 kilohertz (kHz) and its multiples. Also, in the RF sputtering process, argon flows the chamber with 3~10 standard cubic centimeters per minute (sccm).

In one implementation, the barrier metal layer consists of a first barrier metal layer and a second barrier metal layer. The first barrier metal layer is Ti deposited by a PVD method and the second barrier metal layer is TiN deposited by a PVD or CVD method.

A sputter etch method for forming a silicide of a semiconductor device, which is another example implementation, comprises cleaning a semiconductor substrate, on which a transistor is formed to remove a native oxide layer, performing a sputter etch in a chamber in which a conditioning is completed, depositing a cobalt layer on the semiconductor substrate, forming a protective metal layer over the substrate, and forming a silicide over the substrate.

In such an arrangement, the conditioning may be carried out by depositing a metal coating layer on the inside wall of the chamber. The metal coating is, for example, conducted for 0.5~5 minutes and up to at most 5 times. The conditioning of the sputter etch chamber proceeds at 1~2 times per 1~4 lots before the main lot.

The coating metal on the inside wall of a sputter etch chamber is one selected from the group consisting of aluminum, an aluminum compound, titanium, a titanium compound, cobalt, and a cobalt compound. The coating is conducted on a targeted substrate, on which a metal layer is deposited by means of an RF sputtering process.

The target substrate for an RF sputtering process according to one example uses a silicon wafer having a thickness of 100~15,000 angstroms, on which aluminum, an aluminum alloy including 0.2~1.0% copper, an aluminum alloy including 0.2~1.0% copper and 0.5~2% silicon, or an aluminum alloy including 0.5~2% silicon is deposited.

In addition, the target substrate for an RF sputtering process may use a silicon wafer, which has a thickness of 100~10,000 angstroms, on which titanium, a titanium compound, cobalt, or a cobalt compound is deposited.

In the foregoing arrangements, the metal on the substrate is deposited by a PVD or CVD method.

The substrate has a diameter of 199~201 mm and a thickness of 0.2~3 mm. It uses one selected from the group consisting of aluminum, an aluminum alloy, an aluminum compound, titanium, a titanium compound, cobalt, a cobalt compound, stainless steel, nickel, a nickel compound, gold, a gold compound, silver, and a silver compound.

The conditioning in an RF sputtering process uses an RF power supply of 100~500 watts for a target and an RF power supply of 50~300 watts for the inside wall of a chamber. The RF power frequency for a target is one frequency selected from the group consisting of 13.56 megahertz (MHz) and its multiples, and the RF power frequency for the inside wall of a chamber is one frequency selected from the group consisting of 400 kilohertz (kHz) and its multiples. In the RF sputtering process, argon flows the chamber with 3~10 standard cubic centimeters per minute (sccm).

The cobalt layer may be deposited by a PVD method.

The protective metal layer on the substrate is Ti or TiN deposited by a PVD method.

Accordingly, the sputter etch methods disclosed herein may enhance a reliability for a fabrication process of a semiconductor device under the environment of the substantial decrease in impurity falling probability. In other words, the impurity falling probability can be decreased by coating a metal layer on the wall of the sputter etch chamber employing a wafer on which a barrier metal layer is deposited right before a main lot in a sputter etch process.

As disclosed above, the disclosed methods provide a highly reliable fabrication process of a semiconductor device under the environment of reduced impurities by performing a sputter etch process in a sputter etch chamber conditioned for a metal coating in a deposition apparatus for a barrier metal layer.

As disclosed above, as broadly described herein, a sputter etch method for etching a layer on a semiconductor substrate in a chamber by RF plasma, includes loading a substrate for conditioning into the chamber, depositing a metal coating layer on the inside wall of the chamber by sputter etching the substrate for conditioning in the chamber, unloading the substrate for conditioning from the chamber, loading the semiconductor substrate with the layer, and etching the layer on the semiconductor substrate.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A sputter etch method for etching a layer on a semiconductor substrate in a chamber by radio frequency (RF) plasma, comprising:
   (a) loading a substrate for conditioning into the chamber;
   (b) depositing a metal coating layer on the inside wall of the chamber by sputter etching the substrate for conditioning in the chamber;
   (c) unloading the substrate for conditioning from the chamber;
   (d) loading the semiconductor substrate with the layer; and
   (e) etching the layer on the semiconductor substrate.

2. A method as defined in claim 1, wherein the metal coating layer on the inside wall of the chamber is one selected from the group consisting of aluminum, an aluminum alloy, an aluminum compound, titanium, a titanium compound, cobalt, a cobalt compound, stainless steel, nickel, a nickel compound, gold, a gold compound, silver, and a silver compound.

3. A method as defined in claim 1, wherein the substrate for conditioning in the chamber has a metal layer deposited on the top of the substrate.

4. A method as defined in claim 3, wherein the metal layer has a thickness of 100~15,000 angstroms (Å).

5. A method as defined in claim 4, wherein the metal layer is one selected from the group consisting of aluminum, an aluminum alloy, an aluminum compound, titanium, a titanium compound, cobalt, a cobalt compound, stainless steel, nickel, a nickel compound, gold, a gold compound, silver, and a silver compound.

6. A method as defined in claim 1, wherein the substrate for conditioning in the chamber is a metal substrate consisting of metal layers.

7. A method as defined in claim 6, wherein the metal substrate has a thickness of 0.2~3 millimeters.

8. A method as defined in claim 6, wherein the metal substrate is one selected from the group consisting of aluminum, an aluminum alloy, an aluminum compound, titanium, a titanium compound, cobalt, a cobalt compound, stainless steel, nickel, a nickel compound, gold, a gold compound, silver, and a silver compound.

9. A method as defined in claim 1, wherein the sputter etching for depositing the metal coating layer uses an RF power supply of 100~150 watts (W) for a substrate, whose frequency is one frequency selected from the group consisting of 13.56 megahertz (MHz) and its multiples, and an RF power supply of 50~300 watts (W) for the inside wall of the chamber, whose frequency is one frequency selected from the group consisting of 400 kilohertz (kHz) and its multiples.

10. A method as defined in claim 1, wherein the sputter etching for depositing the metal coating layer uses argon flowing the chamber with 3~10 standard cubic centimeters per minute (sccm).

* * * * *